United States Patent
Xiao et al.

(10) Patent No.: US 9,741,743 B2
(45) Date of Patent: Aug. 22, 2017

(54) ARRAY SUBSTRATE AND FABRICATION METHOD THEREOF, DISPLAY PANEL AND DISPLAY DEVICE

(71) Applicant: BOE TECHNOLOGY GROUP CO., LTD., Beijing (CN)

(72) Inventors: Li Xiao, Beijing (CN); Qiangtao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/082,478

(22) Filed: Mar. 28, 2016

(65) Prior Publication Data

US 2016/0300861 A1     Oct. 13, 2016

(30) Foreign Application Priority Data

Apr. 9, 2015   (CN) .......................... 2015 1 0166166

(51) Int. Cl.
| H01L 29/10 | (2006.01) |
| H01L 27/12 | (2006.01) |
| H01L 29/786 | (2006.01) |
| H01L 29/423 | (2006.01) |
| G02F 1/1362 | (2006.01) |

(52) U.S. Cl.
CPC .... *H01L 27/1225* (2013.01); *G02F 1/136209* (2013.01); *H01L 27/124* (2013.01); *H01L 27/1259* (2013.01); *H01L 29/42356* (2013.01); *H01L 29/78633* (2013.01); *H01L 29/78693* (2013.01); *G02F 2001/136295* (2013.01)

(58) Field of Classification Search
CPC ............. H01L 29/7831; H01L 27/1222; H01L 27/3244; H01L 27/3262
See application file for complete search history.

(56) References Cited

U.S. PATENT DOCUMENTS

| 2009/0079333 A1* | 3/2009 | Koo ................... H01L 51/5203 |
| | | 313/504 |
| 2015/0144905 A1* | 5/2015 | Kim ................... H01L 29/7831 |
| | | 257/40 |
| 2016/0195745 A1* | 7/2016 | Xu .................... G02F 1/136209 |
| | | 349/43 |

FOREIGN PATENT DOCUMENTS

| CN | 1949484 A | 4/2007 |
| CN | 103943626 A | 7/2014 |

OTHER PUBLICATIONS

First Chinese Office Action dated Jun. 2, 2017.

* cited by examiner

*Primary Examiner* — Julia Slutsker

(74) *Attorney, Agent, or Firm* — Dilworth & Barrese LLP; Michael J. Musella

(57) ABSTRACT

Embodiments of the present invention disclose an array substrate comprising: a base substrate, a gate line and a gate electrode located on the base substrate; an insulating layer covering the gate line and the gate electrode; an active layer on the insulating layer, corresponding to the gate electrode; an etch stop layer above the active layer, the etch stop layer including a first via hole and a second via hole located above the active layer; a data line, a source electrode and a drain electrode and a pixel electrode on the etch stop layer, wherein the source electrode is connected with the active layer through the first via hole, wherein the etch stop layer is made of a light-shielding material.

11 Claims, 2 Drawing Sheets

ARRAY SUBSTRATE AND FABRICATION METHOD THEREOF, DISPLAY PANEL AND DISPLAY DEVICE

TECHNICAL FIELD

Embodiments of the present invention relate to an array substrate and a fabrication method thereof, a display panel and a display device.

BACKGROUND

In the field of flat-panel display led by Thin film Transistor-Liquid Crystal Display (TFT-LCD) device, demands on high-precision and high-frequency driving and so on are increasing, so as to meet requirements of high quality. Thus, higher requirements on electron mobility of a TFT are put forward, so it is an important development direction of the TFT-LCD to fabricate a semiconductor thin film transistor by using an amorphous oxide.

SUMMARY

An embodiment of the invention provides a fabrication method of an array substrate, comprising: forming a gate line and a gate electrode on a base substrate; forming an insulating layer covering the gate line and the gate electrode; forming an active layer on a position of the insulating layer corresponding to the gate electrode; forming an etch stop layer covering the active layer, the etch stop layer being made of a light-shielding material, and the etch stop layer including a first via hole and a second via hole formed therein and located above the active layer; forming a data line, a source electrode and a drain electrode, wherein the source electrode is connected with the active layer through the first via hole, the drain electrode is connected with the active layer through the second via hole, the source electrode is further connected with the data line; forming a pixel electrode connected with the drain electrode.

Another embodiment of the invention provides an array substrate comprising: a base substrate, a gate line and a gate electrode located on the base substrate; an insulating layer covering the gate line and the gate electrode; an active layer on the insulating layer, corresponding to the gate electrode; an etch stop layer above the active layer, the etch stop layer including a first via hole and a second via hole located above the active layer; a data line, a source electrode and a drain electrode and a pixel electrode on the etch stop layer, wherein the source electrode is connected with the active layer through the first via hole, the drain electrode is connected with the active layer through the second via hole, the source electrode is further connected with the data line, and the drain electrode is connected with the pixel electrode, wherein the etch stop layer is made of a light-shielding material.

Yet another embodiment of the invention provides a display panel, comprising an array substrate and an opposed substrate which are cell-assembled, wherein, the array substrate is the above described array substrate.

Yet another embodiment of the invention provides a display device comprising the above described display panel.

BRIEF DESCRIPTION OF THE DRAWINGS

In order to clearly illustrate the technical solution in the embodiments of the present invention or in the prior art, the drawings necessary for description of the embodiments or the prior art will be briefly described hereinafter; it is obvious that the described drawings are only related to some embodiments of the present invention, for which one ordinarily skilled in the art still can obtain other drawings without inventive work based on these drawings.

DETAILED DESCRIPTION

In a related art, an Etch Stop Type (ESL) serves as a common-used structure of an oxide TFT, and an etch stop layer used in a TFT of ESL structure is usually an oxide insulating layer such as SiOx and the like. A Source/Drain (S/D) layer is connected with an active layer through a via hole on the etch stop layer; in fabrication process of a display panel, a layer of an etch stop layer covering all structures on an array substrate is often fabricated above the active layer, and in this way, an additional mask is needed for fabricating the via hole of the etch stop layer in the fabrication processes, and meanwhile, according to a traditional process, a Black Matrix (BM) and a pixel color film are designed to be formed on a color filter substrate, and finally a panel is completed by cell-assembling. In the related art, the fabrication process of the ESL type oxide TFT is complex, and transmission rate is also affected by adding the etch stop layer.

In order to make objects, technical details and advantages of the embodiments of the present invention apparent, the technical solutions of the embodiment will be described in a clearly and fully understandable way in connection with the drawings related to the embodiments of the present invention. It is obvious that the described embodiments are just a part but not all of the embodiments of the present invention. Based on the described embodiments herein, those skilled in the art can obtain other embodiment(s), without any inventive work, which should be within the scope of the present invention.

Unless otherwise specified, the technical terms or scientific terms here should be of general meanings as understood by those ordinarily skilled in the art. In the specification and claims of the present disclosure of the patent application, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects. "connected" or "coupled" or similar words are not limited to physical or mechanical connection, and may comprise electrical connection, either direct or indirect connection. Words such as "up", "down", "left", "right" and the like are only used for expressing relative positional relationship, when the absolute position of a described object is changed, the relative positional relationship may also be correspondingly changed.

Embodiments of the present invention provide an array substrate and a fabrication method thereof, a display panel and a display device, which can reduce fabrication processes of the display panel.

Figure 1:
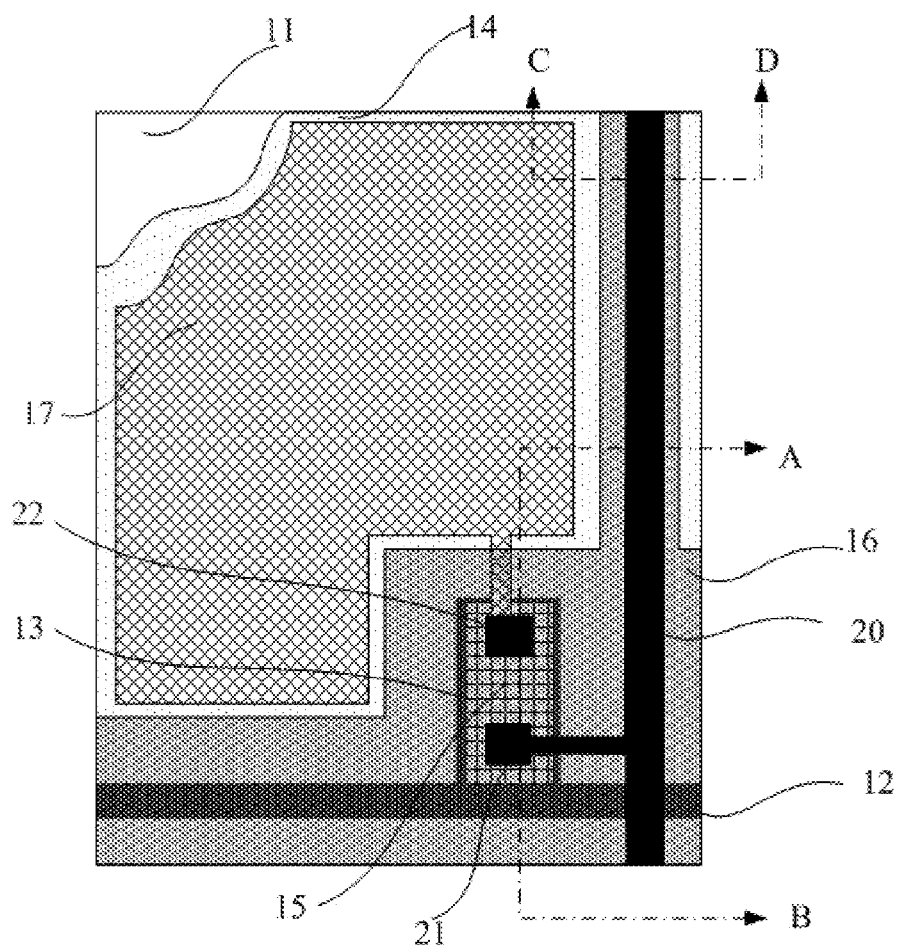
FIG. 1 is a structural schematic diagram of an array substrate provided by an embodiment of the present invention.
Figure 2:
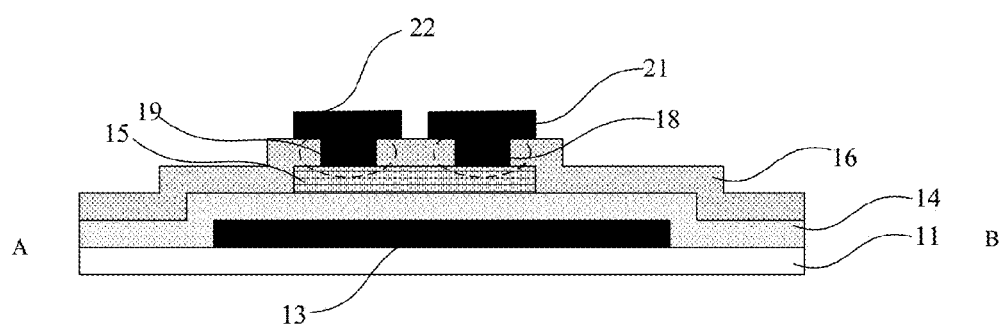
FIG. 2 is a structural schematic diagram of a cross-section AB of the array substrate in FIG. 1 provided by the embodiment of the present invention.
Figure 3:
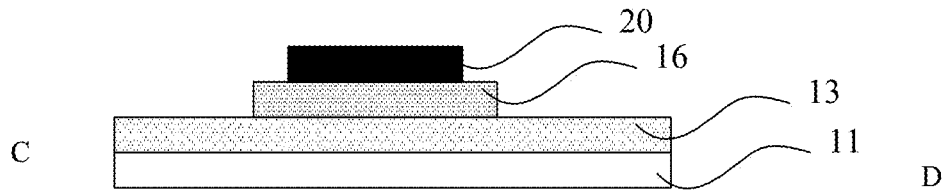
FIG. 3 is a structural schematic diagram of a cross-section CD of the array substrate in FIG. 1 provided by the embodiment of the present invention.

An embodiment of the present invention provides an array substrate, referring to FIGS. 1, 2 and 3, comprising: a base substrate 11, a gate line 12 and a gate electrode 13 located on the base substrate 11; an insulating layer 14 covering the gate line 12 and the gate electrode 13; an active layer 15 on the insulating layer 14, corresponding to the gate electrode 13; an etch stop layer 16 above the active layer 15; and a data line 20, a source electrode 21 and a drain electrode 22, and a pixel electrode 17 on the etch stop layer 16. For simplifying, the pixel electrode 17 is not shown in FIGS. 2 and 3.

The etch stop layer 16 is made of a light-shielding material. The etch stop layer 16 at a position corresponding to the pixel electrode 17 is hollow. For example, a vertical projection of the pixel electrode 17 on the upper surface of the base substrate 11 is located outside a vertical projection of the etch stop layer 16 on an upper surface of the base substrate 11. In an example, a vertical projection of the etch stop layer 16 on the upper surface of the base substrate 11 does not overlap with a vertical projection of the pixel electrode 17 on the upper surface of the base substrate 11. Referring to FIG. 1, the vertical projection of the etch stop layer 16 on the upper surface of the base substrate 11 is separated from the vertical projection of the pixel electrode 17 on the upper surface of the base substrate 11. Although it is not shown, in another example, an edge of the vertical projection of the etch stop layer 16 on the upper surface of the base substrate 11 at least partially coincides with an edge of the vertical projection of the pixel electrode 17 on the upper surface of the base substrate 11.

In the etch stop layer 16, there are formed a first via hole 18 and a second via hole 19 located above the active layer 15.

The source electrode 21 is connected with the active layer 15 through the first via hole 18, and the drain electrode 22 is connected with the active layer 15 through the second via hole 19. The source electrode 21 is connected with the data line 20, and the drain electrode 22 is connected with the pixel electrode 17.

In the array substrate provided by the above embodiment, the etch stop layer is made of a light-shielding material, and the etch stop layer at a position corresponding to the pixel electrode is hollow, so that it is not necessary to fabricate a black matrix on an opposed substrate, and fabrication processes of a display panel can be reduced. In addition, as compared with a traditional etch stop layer covering the whole region of a pixel electrode, a hollowed-out design of the etch stop layer in the embodiment of the present invention thus can increase a transmission rate of the display panel.

Optionally, vertical projections of the gate line 12, the active layer 15 and the data line 20 on the upper surface of the base substrate 11 are all located within the vertical projection of the etch stop layer 16 on the upper surface of the base substrate 11. As shown in FIG. 1, the vertical projections of the gate line 12, the active layer 15 and the data line 20 on the upper surface of the base substrate 11 are all located in the vertical projection of the etch stop layer 16 on the upper surface of the base substrate 11, and are not in contact with an edge of the vertical projection of the etch stop layer 16 on the upper surface of the base substrate 11.

It should be understood that, in another example, vertical projections of the gate line 12, the active layer 15 and the data line 20 on the base substrate 11 can be also in contact with the edge of the vertical projection of the etch stop layer 16 on the upper surface of the base substrate 11.

In the related art, an array substrate and a color filter substrate of a liquid crystal display panel are separately fabricated. The fabricated array substrate and the fabricated color filter substrate are bonded to form a display panel by a box-forming process. There are generally alignment accuracy errors in the cell-assembling process, and thus, in order to avoid misalignment between a BM region on the color filter substrate and an non-transparent region except a pixel electrode on the array substrate caused by the alignment accuracy, in a fabrication process of the color filter substrate, the BM misalignment is often considered, and a design that an edge of BM exceeds the Non-transparent region except the pixel electrode on the array substrate may be adopted, and an assy margin of BM is often 8 to 10 microns, which may significantly reduce an aperture ratio of the display panel.

In the embodiments of the present invention, the light-shielding black matrix is directly fabricated on the array substrate as an etch stop layer, technical accuracy may be controlled to be minimum. If the vertical projection of the etch stop layer 16 on the upper surface of the base substrate 11 exactly coincides with the union of the vertical projections of the gate line 12, the active layer 15 and the data line 20 on the upper surface of the base substrate 11, the assy margin of the etch stop layer can be controlled within 1 to 2 microns by the fabrication process of the array substrate, so as to greatly improve the aperture ratio of the display panel.

In addition, the etch stop layer in the above solutions can be made of a light-shielding material which meets technical requirements for fabricating the array substrate. There is provided an example that the etch stop layer is made of a black matrix material. In the related art, the etch stop layer is often made of a silicon oxide material; in order to reduce a thickness of the substrate, a thickness of the etch stop layer is usually controlled to be small, which may result in relatively large coupling capacitance of the TFT. In the embodiments of the present invention, the etch stop layer is made of a black matrix (BM) material, so as to omit a BM layer in the color filter substrate. Therefore, when the etch stop layer is fabricated to have a thickness of the BM layer required in the color filter substrate, not only the thickness of the substrate can not be increased, but also parasitic capacitance can be reduced. Exemplarily, a set of experimental data is given as follows: for a material of a gate insulating layer (GI): dielectric coefficient: $\in_1 = 7$, thickness: $d = 0.4$ micron; for an etch stop layer: when a silicon oxide material is used, dielectric coefficient of the material: $\in_2 = 4$, thickness: $d = 0.2$ micron; and when a BM material is used, dielectric coefficient of the material: $\in_3 = 4$, thickness: $d = 1.5$ micron; A computational formula of capacitance of a parallel-plate capacitor is $C = \in S/d$, where, S is an overlapping area between two parallel electrode plates, d is a distance between the two parallel electrode plates, and $\in$ is a dielectric coefficient of a dielectric medium between the two parallel electrode plates. It is assumed that, an overlapping area between the source-drain electrode and the gate electrode is A, so total coupling capacitance is that: $C = 1/(1/CGI + 1/(Cgs + Cgd))$, where, CGI is a coupling capacitance caused by the gate insulating layer, Cgs is a coupling capacitance caused by the etch stop layer at the source electrode, and Cgd is a coupling capacitance caused by the etch stop layer at the drain electrode; a coupling capacitance of a traditional TFT is obtained by bringing the above data into the formula: $C1=1/(1/17.5A+1/20A) \approx 9.3A$; in the embodiment of the present invention, when the etch stop layer is made of a BM material, the coupling capacitance is that: $C2=1/(1/17.5A+3/8A) \approx 1.8A$. Obviously, in the case that the etch stop layer is made of a BM material, the coupling capacitance of the TFT is about 1/5 of the original, so that power consumption is effectively reduced, and a response speed of the panel is improved.

Optionally, the active layer is made of an amorphous oxide material. A carrier mobility of a TFT having an active layer made of an amorphous oxide material is 20 to 30 times as high as a TFT having an active layer made of an amorphous silicon material, so that a charging and discharging speed of the TFT to a pixel electrode can be greatly improved, a response speed of a pixel is improved, a faster refreshing rate is realized, and meanwhile, a line scanning rate of pixels is further improved with faster response, so that a display panel of ultrahigh resolution is possible.

Another embodiment of the present invention provides a display panel, comprising an array substrate and an opposed substrate which are cell-assembled. The array substrate is any array substrate provided by the above embodiment. For example, the opposed substrate is a color filter substrate with a color filter layer formed thereon.

Yet another embodiment of the present invention provides a display device, comprising the display panel provided by the above embodiment. The display device may be any product or component with a display function, such as a liquid crystal display device, a liquid crystal television, a digital camera, a mobile phone, a tablet computer and so on.

Figure 4:
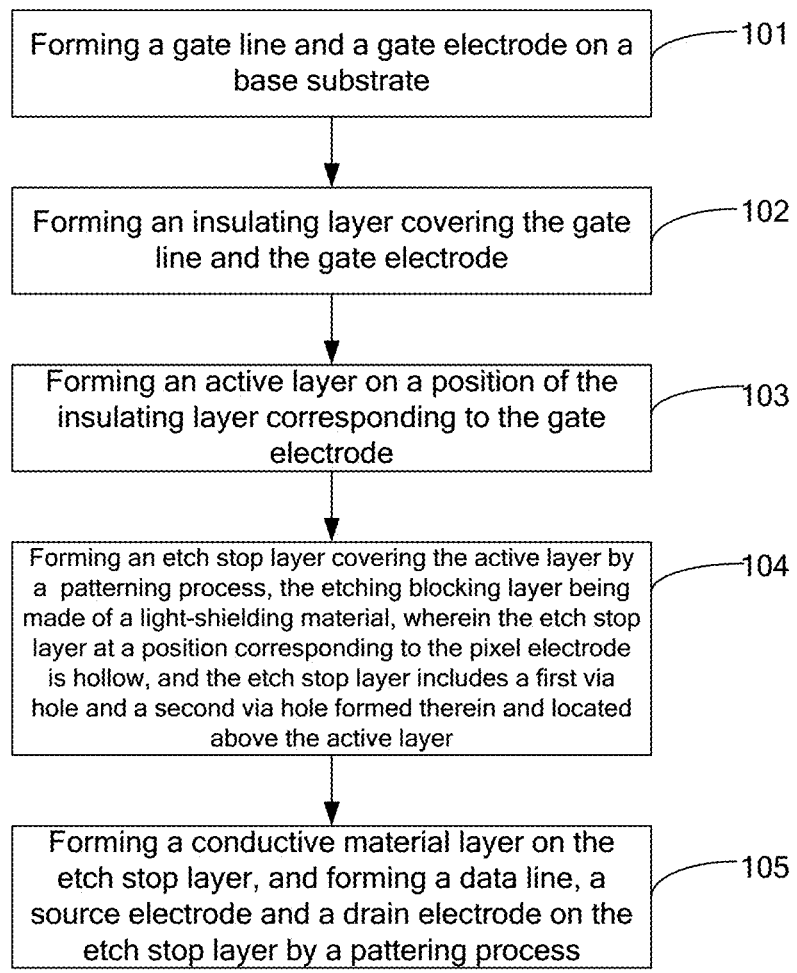
FIG. 4 is a flow chart of a fabrication method of an array substrate provided by an embodiment of the present invention.

A further embodiment of the present invention provides a fabrication method of an array substrate of the array substrate provided by the above embodiment, referring to FIG. 4, and the method comprises steps of:

Step 101: forming a gate line and a gate electrode on a base substrate;

Herein, the base substrate may be a glass substrate or a resin substrate. The step 101 can be implemented as follows: depositing a metal thin film layer on a base substrate, and obtaining a gate line and a gate electrode by patterning the metal thin film layer. For example, a metal thin film layer having a thickness of 1,000 Å to 7,000 Å may be prepared on a base substrate by using a magnetron sputtering method. The metal thin film layer, for example, may be made of at least one of molybdenum, aluminum, aluminum-nickel alloy, molybdenum-tungsten alloy, chromium, copper and alloy thereof. The metal thin film layer may be of either a single-layer structure or a multi-layer structure. Then, the metal thin film layer is coated with a photoresist, and processed by a patterning process containing exposing, developing, etching and stripping with a mask, and finally a plurality of horizontal gate lines and gate electrodes connecting with the gate lines are formed in a certain region on the base substrate; it is only an example that the gate line and the gate electrode are made of the metal material by using a magnetron sputtering method, the gate line and the gate electrode may also be made of other conductive materials by using other processes.

Step 102: forming an insulating layer covering the gate line and the gate electrode;

A gate insulating layer having a thickness of 1000 Å to 6000 Å may be deposited on the gate line and the gate electrode by using a Plasma Enhanced Chemical Vapor Deposition (PECVD) method; the gate insulating layer is usually made of silicon nitride, silicon oxide or silicon oxynitride, etc.

Step 103: forming an active layer on the insulating layer, corresponding to the gate electrode;

An amorphous silicon thin film and a n+ amorphous silicon thin film having a thickness of 1000 Å to 6000 Å may be deposited on the insulating layer by using a Plasma Enhanced Chemical Vapor Deposition (PECVD) method, or an amorphous oxide thin film may be deposited on the insulating layer thin film, e.g., a metal oxide semiconductor thin film; the amorphous silicon thin film is exposed by a mask of an active layer, and then the amorphous silicon thin film is dry etched to form an active layer above the gate electrode. In addition, if a metal oxide semiconductor thin film is deposited on the insulating layer thin film for forming an active layer, the active layer may be formed by patterning the metal oxide semiconductor thin film. That is, after coated with the photoresist, the substrate is exposed, developed and etched with a common mask to form a semiconductor active layer.

Step 104: forming an etch stop layer covering the active layer by a patterning process, the etch stop layer being made of a light-shielding material, wherein the etch stop layer includes a first via hole and a second via hole formed therein and located above the active layer;

Herein, the etch stop layer may be formed by using a fabrication process similar to that of the insulating layer. For example, step 104 includes: forming a etch stop thin film layer, hollowing out a portion of the etch stop layer corresponding to a pixel electrode to be formed, and forming a first via hole exposing the source electrode and a second via hole exposing the drain electrode which are located above the active layer. Optionally, vertical projections of the gate line 12, the active layer 15 and the data line 20 on the upper surface of the base substrate 11 are all located in a vertical projection of the etch stop layer 16 on the upper surface of the base substrate 11. Optionally, the etch stop layer is made of a black matrix (BM) material. The black matrix (BM) material for example includes resin material and photoresist material. When the black matrix material is adopted, the BM material for fabricating the etch stop layer may be coated on the array substrate formed in step 103 by a spin coating process.

Step 105: forming a conductive material layer on the etch stop layer, and forming a data line, a source electrode and a drain electrode on the etch stop layer by patterning the conductive material layer.

Herein, the source electrode is connected with the active layer through the first via hole, the drain electrode is connected with the active layer through the second via hole, the source electrode is further connected with the data line, and the drain electrode is connected with the pixel electrode. In step 105, the data line, the source electrode and the drain electrode may be formed in a manner similar to that for fabricating the gate electrode and the gate line in step 101.

In order to complete fabrication of the array substrate, after step 105, the method further includes fabrication steps of a pixel electrode, an alignment layer and so on; in the embodiment of the invention, no improvement is made for structures and processes of those features, the related description is omitted herein.

In the fabrication method of the array substrate provided by the above embodiment, the etch stop layer is made of a light-shielding material, and a portion of the etch stop layer corresponding to a pixel electrode is hollowed out, so that it's not necessary to fabricate a black matrix on a color filter substrate, and fabrication processes of a display panel can be reduced; in addition, comparing with a traditional etch stop layer covering whole region of a pixel electrode, a hollowed-out design in the embodiment of the present invention thus can increase a transmission rate of the display panel.

Although the embodiment of the present invention has been described above in great detail with general descriptions and specific embodiments, on the basis of the embodiment of the present invention, various changes and improvements may be made, which is apparent to those skilled in the art. Therefore, these modifications or improvements without departing from the spirit of the present invention all belong to the protection scope claimed by the present invention.

The present application claims priority of Chinese Patent Application No. 201510166166.5 filed on Apr. 9, 2015, the disclosure of which is incorporated herein by reference in its entirety as part of the present application

The invention claimed is:

1. A fabrication method of an array substrate, comprising:
    forming a gate line and a gate electrode on a base substrate;
    forming an insulating layer covering the gate line and the gate electrode;
    forming an active layer on a position of the insulating layer corresponding to the gate electrode;
    forming an etch stop layer covering the active layer, the etch stop layer being made of a light-shielding material, and the etch stop layer including a first via hole and a second via hole formed therein and located above the active layer;
    forming a data line, a source electrode and a drain electrode, wherein the source electrode is connected with the active layer through the first via hole, the drain electrode is connected with the active layer through the second via hole, the source electrode is further connected with the data line;
    forming a pixel electrode connected with the drain electrode,
    wherein the etch stop layer is made of a black matrix material.

2. The method according to claim 1, wherein, vertical projections of the gate line, the active layer and the data line on an upper surface of the base substrate are all located within a vertical projection of the etch stop layer on the upper surface of the base substrate.

3. The method according to claim 1, wherein, the active layer is made of an amorphous oxide material.

4. The method according to claim 1, wherein, the etch stop layer at a position corresponding to the pixel electrode is hollow.

5. An array substrate, comprising:
    a base substrate, a gate line and a gate electrode located on the base substrate;
    an insulating layer covering the gate line and the gate electrode;
    an active layer on the insulating layer, corresponding to the gate electrode;
    an etch stop layer above the active layer, the etch stop layer including a first via hole and a second via hole located above the active layer;
    a data line, a source electrode and a drain electrode and a pixel electrode on the etch stop layer, wherein the source electrode is connected with the active layer through the first via hole, the drain electrode is connected with the active layer through the second via hole, the source electrode is further connected with the data line, and the drain electrode is connected with the pixel electrode, wherein the etch stop layer is made of a light-shielding material,
    wherein the etch stop layer is made of a black matrix material.

6. The array substrate according to claim 5, wherein, vertical projections of the gate line, the active layer and the data line on an upper surface of the base substrate are all located within a vertical projection of the etch stop layer on the upper surface of the base substrate.

7. The array substrate according to claim 5, wherein, the active layer is made of an amorphous oxide material.

8. The array substrate according to claim 5, wherein, the etch stop layer at a position corresponding to the pixel electrode is hollow.

9. A display panel, comprising an array substrate and an opposed substrate which are cell-assembled, wherein, the array substrate is the array substrate according to claim 5.

10. The display panel according to claim 9, wherein, the opposed substrate is a color filter substrate, and no black matrix layer is formed on the color filter substrate.

11. A display device, comprising the display panel according to claim 9.

* * * * *